(12) United States Patent
Takayama

(10) Patent No.: US 7,239,189 B2
(45) Date of Patent: Jul. 3, 2007

(54) CLOCK GENERATING CIRCUIT

(75) Inventor: Katsuhiko Takayama, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 138 days.

(21) Appl. No.: 11/206,142

(22) Filed: Aug. 18, 2005

(65) Prior Publication Data

US 2006/0055473 A1   Mar. 16, 2006

(30) Foreign Application Priority Data

Aug. 26, 2004   (JP) .............................. 2004-246733

(51) Int. Cl.
*H03L 7/00*   (2006.01)

(52) U.S. Cl. ...................... 327/161; 327/291; 327/327; 327/271

(58) Field of Classification Search ................ 327/149, 327/153, 158, 161, 271, 277, 284, 291–298; 331/17, 25; 375/373–376
See application file for complete search history.

(56) References Cited

U.S. PATENT DOCUMENTS

| | | | |
|---|---|---|---|
| 6,005,421 A | 12/1999 | Saeki | 327/119 |
| 6,052,004 A | 4/2000 | Saeki | 327/116 |
| 6,222,408 B1 | 4/2001 | Saeki | 327/271 |
| 6,441,657 B1 | 8/2002 | Saeki | 327/119 |
| 6,564,359 B2 | 5/2003 | Saeki | 716/5 |
| 7,084,686 B2 * | 8/2006 | Zimlich | 327/291 |

FOREIGN PATENT DOCUMENTS

| | | |
|---|---|---|
| JP | 10-303713 | 11/1998 |
| JP | 10-335994 | 12/1998 |
| JP | 11-4145 | 1/1999 |
| JP | 11-112309 | 4/1999 |
| JP | 2002-163034 A | 6/2002 |

* cited by examiner

*Primary Examiner*—Linh My Nguyen
(74) *Attorney, Agent, or Firm*—Foley & Lardner LLP

(57) ABSTRACT

A clock generating circuit includes a first delay circuit array, which has a plurality of delay circuits, for measuring delay of an input signal, and a second delay circuit array for delay-replay having a plurality of delay circuits and being arranged in a direction opposite a direction of signal propagation in the first delay circuit array. On the basis of a signal that is output from a delay circuit at a position where a delay has been detected in the first delay circuit array, an output terminal of a delay circuit in the second delay circuit array that corresponds to the position where the delay has been detected in the first delay circuit array is fed back to an input terminal of this delay circuit to thereby construct a closed loop and form a ring oscillator circuit. An oscillation output signal of the ring oscillator circuit is extracted from an output terminal of the second delay circuit array. Two phase interpolators are provided on the input end of the first delay circuit array for variably controlling the phase of the output signal relative to the input signal. The first delay circuit array measures the phase difference between the output signals of the two phase interpolators.

13 Claims, 9 Drawing Sheets

CLOCK GENERATING CIRCUIT

FIELD OF THE INVENTION

This invention relates to a clock generating circuit and, more particularly, to a clock generating circuit that lends itself to a reduction in power dissipation.

BACKGROUND OF THE INVENTION

With the advances of miniaturization in recent years, there is a growing tendency for semiconductor integrated circuits to be afforded with a higher degree of integration, greater scale and higher speed. The larger the scale of the circuit, the greater the skew of the clock signal that drives the circuit elements. To deal with this problem, it is now required that each functional block within a semiconductor integrated circuit be supplied with a clock signal of any desired timing.

A PLL (Phase-Locked Loop) or DLL (Delay-Locked Loop), etc., has long been used as a clock generating circuit for generating an internal clock of a semiconductor integrated circuit. Since control of such a feedback circuit is complicated, locking takes time (convergence time is long), the circuit is large in scale and power dissipation is high. For reference purposes, FIG. 7 illustrates the structure of a well-known ordinary PLL circuit. The PLL includes a phase comparator 101 for comparing the phase of an input clock signal and the phase of a frequency divider 106; a charge pump 102 for charging and discharging a capacitor based upon the output of the phase comparator 101 so as to output a voltage that conforms to the result of the phase comparison; a loop filter 103 for smoothing the output of the charge pump 102; a voltage-controlled oscillator (VCO) 104 for receiving the output of the charge pump 102 as a control voltage and varying oscillation frequency; a prescaler 105 for dividing the frequency of the oscillatory output clock of the VCO 104; and the frequency divider 106 for dividing the frequency of the output of prescaler 105. (There are also PLL arrangement that do not include the prescaler 105.) It should be noted that in a circuit capable of implementing fractional frequency division, for example, the frequency divider 106 is constituted by a pulse-swallow counter, etc., for varying the counting period (number of counts) based upon the output of the prescaler 105. The VCO 104 is constituted by a ring oscillator as obtained by connecting inverters (not shown) into a ring of odd-numbered stages, and transistor elements (not shown), whose bias voltage is varied based upon the control voltage so as to vary the output current, are inserted serially between each inverter and the power supply. By varying the driving current of the inverters that compose the ring oscillator based upon the control voltage, propagation delay time tpd (gain) is varied, whereby the oscillation frequency of the VCO 104 is controlled and changed.

By way of example, refer to the specification of Japanese Patent Kokai Publication No. JP-A-11-112309, which discloses a synchronous delay circuit (referred to as a "synchronous mirror delay", or "SMD") having a first delay circuit array (a measurement line) for measuring period or delay and a second delay circuit array (a replay line) for reproducing a measured delay. Further, the specifications of Japanese Patent Kokai Publication Nos. JP-A-10-303713 and JP-A-10-335994 disclose a clock frequency multiplier circuit that uses a synchronous delay circuit.

Refer to the specifications of Japanese Patent Kokai Publication Nos. JP-A-11-4145 and JP-P2002-163034A as examples of a clock frequency multiplier circuit that uses interpolators in which the phase of the output signal relative to the input signal is varied and controlled based upon a control signal. Japanese Patent Kokai Publication No. JP-A-11-4145 discloses a clock frequency multiplier circuit having a frequency divider, a plurality of interpolators (timing-difference splitting devices) the input to which is a frequency-divided clock, and a circuit for combining the outputs of the interpolators. In the circuits described in Japanese Patent Kokai Publication No. JP-A-11-4145, etc., weighting is applied by the interpolators and a logical operation is applied to generate a frequency-multiplied clock.

FIG. 8 is a diagram schematically illustrating the configuration of a clock multiplier circuit that employs a synchronous delay circuit having a first delay circuit array (a measurement line) 201 for measuring delay (clock period) and a second delay circuit array (a replay line) 202 for reproducing the measured delay, as well as a combinational circuit 203. The first delay circuit array 201 measures the input period, the second delay circuit 202 for reproducing delay creates timings of 1/N, 2/N, ... of the input, and the combinational circuit 203 applies a prescribed logical operation to realize a desired frequency-multiplying number. FIG. 9 is a diagram useful in describing the timing operation of FIG. 8. In FIG. 9, IN1 represents a signal that is the result of frequency-dividing the input clock signal in a frequency divider 204 (frequency division by 4 in the example of FIG. 8), and IN2 represents a signal that is the result of delaying the signal IN1 by, e.g., one clock period in a delay element 205. The delay element 205 comprises a flip-flop that samples and outputs the frequency-divided clock signal of the frequency divider 204 at the rising edge of the input clock signal. In the example depicted in FIG. 9, the flip-flop constructing the delay element 205 of FIG. 8 outputs a signal, which is the inverse of the data signal, at the rising edge of the input clock signal.

The clock multiplier circuit using the interpolators described above has a number of problems.

The first problem is that the output is asynchronous with respect to the input clock signal. The cause of this problem resides in the fact that the operating time of the interpolators is irregular.

The second problem is that an error is produced in the duty of the output clock signal in dependence upon the precision of the interpolators.

Further, the clock multiplier circuit that uses the synchronous delay circuit illustrated in FIG. 8, etc., has the following problem shared with the clock multiplier circuit using the interpolators:

Specifically, the scale of the circuitry increases in proportion to the frequency-multiplying number. As multiplication becomes higher, the number of delay circuits or number of timing-difference circuits (interpolators) increases. As a consequence, generating a clock signal that is the result of a high degree of frequency multiplication is substantially impossible.

SUMMARY OF THE DISCLOSURE

A clock generating circuit in accordance with a first aspect of the present invention, comprises: a first delay circuit array for delay measurement having a plurality of delay circuits to which an input signal is applied for outputting a signal from a delay circuit at a position to which the applied input signal has traveled following a prescribed delay time, and a second delay circuit array for delay-replay having a plurality of delay circuits and being arranged in a direction opposite a direction of signal propagation in the first delay circuit array; wherein on the basis of the signal that is output from the delay circuit at the position where the delay has been detected in the first delay circuit array, an output terminal of a delay circuit in the second delay circuit array that corresponds to the position where the delay has been detected in the first delay circuit array is fed back to an input terminal of this delay circuit to thereby construct a closed-loop oscillator circuit, an oscillation output signal being extracted from the oscillator circuit at an output terminal of the second delay circuit array.

In the present invention, delay circuits other than the delay circuit of the second delay circuit array that corresponds to the position where the delay has been detected do not transmit signals to succeeding delay circuits.

In the present invention, a phase interpolator in which the phase of an output signal thereof with respect to an input signal thereof is controlled so as to vary based upon a control signal is provided in front of the first delay circuit array, whereby the delay of the input signal applied to the first delay circuit array for delay measurement is set changeably.

A clock generating circuit in accordance with another aspect of the present invention, comprises: a frequency divider for dividing frequency of an input clock signal; a first phase interpolator to which the frequency-divided clock signal is applied as an input signal for variably interpolating the phase of an output signal thereof with respect to the input signal thereof based upon a control signal and outputting the resultant signal; a latch circuit to which the frequency-divided clock signal is input for sampling and outputting the signal based upon the input clock signal; a second phase interpolator to which the clock signal that is output from the latch circuit is applied as an input signal for variably interpolating the phase of an output signal with respect to the input signal thereof based upon a control signal and outputting the resultant signal; a first delay circuit array in which a plurality of delay units are cascade-connected and to which first and second output signals from the first and second phase interpolators, respectively, are input; and a second delay circuit array in which a plurality of delay units are cascade-connected and which is arranged in a direction opposite a direction of signal propagation in the first delay circuit array; wherein each delay unit of the first delay circuit array includes a delay circuit which, if the delay unit is the initial delay unit, receives the first output signal that is input to the first delay circuit array from the first phase interpolator, and which if the delay unit is other than the initial delay unit, receives the output of the immediately preceding delay unit, and a latch circuit for sampling and outputting the output of the delay circuit based upon the second output signal of the second phase interpolator; and each delay unit of the second delay circuit array includes a logic circuit and a delay circuit to which an output of the logic circuit is input, the logic circuit having one input terminal that receives the output of the first delay circuit array if the delay unit is the initial delay unit and that receives the output of the immediately preceding delay unit if the delay unit is other than the initial delay unit, and another input terminal that receives the output of the latch circuit of the corresponding delay unit of the first delay circuit array, an output terminal of the second delay circuit array being connected to the one input terminal.

In the present invention, fractional frequency multiplication and fractional frequency division can be produced and varied based upon a combination of the internal division ratio of the phase interpolators and delay ratio between the first and second delay circuit arrays.

In accordance with the present invention, there is further provided a clock generating circuit comprising an oscillator constituted by the clock generating circuit of the present invention; a frequency divider for dividing the frequency of the output of the oscillator; a phase comparator for comparing the phase of the output of the frequency divider and the phase of an input signal; a digital filter for smoothing an output of the phase comparator that is input thereto; and a phase interpolator of the clock generating circuit, the phase interpolator receiving the output of the digital filter as a control signal.

In accordance with the present invention, there is further provided a clock generating circuit comprising an oscillator constituted by the clock generating circuit of the present invention; a frequency divider for dividing the frequency of the output of the oscillator; a phase comparator for comparing the phase of the output of the frequency divider and the phase of an input signal; a charge pump for receiving the output of the phase comparator and charging and discharging a capacitor; a filter for smoothing the output of the charge pump; and the second delay circuit array of the clock generating circuit; delay of the second delay circuit array being varied and controlled based upon the output of the filter.

The meritorious effects of the present invention are summarized as follows.

In accordance with the present invention, a delay circuit for reproducing delay of a synchronous delay circuit is used as a ring oscillator. This makes it possible to realize a high degree of frequency multiplication and suppression or reduction of an increase in power dissipation and area.

Further, in accordance with the present invention, fractional frequency multiplication and fractional frequency division can be readily implemented by adopting a simple arrangement that involves setting the amount of interpolation in a phase interpolators and the delay ratio between first and second delay circuit arrays.

Other features and advantages of the present invention will be apparent from the following description taken in conjunction with the accompanying drawings, in which like reference characters designate the same or similar parts throughout the figures thereof.

PREFERRED EMBODIMENTS OF THE INVENTION

Figure 1:
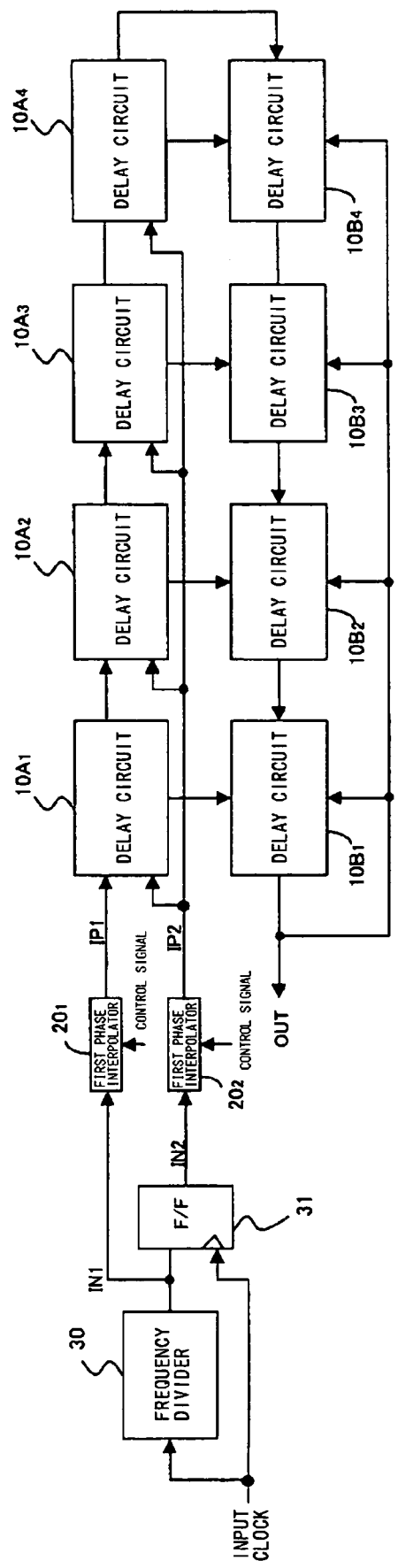
FIG. 1 is a block diagram illustrating the structure of an embodiment of the present invention.

A preferred mode of practicing the present invention will now be described.

A clock generating circuit according to the present invention comprises a first delay circuit array for delay measurement having a plurality of delay circuits to which an input signal is applied for outputting a signal from a delay circuit at a position to which the applied input signal has traveled following a prescribed delay time, and a second delay circuit array for delay-replay having a plurality of delay circuits and being arranged in a direction opposite a direction of signal propagation in the first delay circuit array. Based upon the signal that is output from the delay circuit at the position where the delay has been detected in the first delay circuit array, an output terminal of a delay circuit in the second delay circuit array that corresponds to the position where the delay has been detected in the first delay circuit array is fed back to an input terminal of this delay circuit to thereby construct a closed-loop oscillator circuit. An oscillation output signal is extracted from the oscillator circuit at an output terminal of the second delay circuit array. In accordance with this mode of practicing the present invention, a phase interpolator may be provided in front of the first delay circuit array. More specifically, the clock generating circuit comprises: a frequency divider (30) for dividing the frequency of the input signal; a first phase interpolator ($20_1$), to which the frequency-divided clock signal is applied as an input signal, for variably interpolating the phase of the output signal thereof with respect to the input signal thereof based upon a control signal and outputting the resultant signal; a latch circuit (31) to which the frequency-divided clock signal is input for sampling and outputting the signal based upon the input clock signal; a second phase interpolator ($20_2$), to which the clock signal that is output from the latch circuit is applied as an input signal, for variably interpolating the phase of the output signal thereof with respect to the input signal thereof based upon a control signal and outputting the resultant signal; a first delay circuit array in which a plurality of delay units ($10A_1$ to $10A_4$) are cascade-connected and to which first and second output signals (IP1 and IP2) from the first and second phase interpolators ($20_1$ and $20_2$), respectively, are input; and a second delay circuit array in which a plurality of delay units ($10B_1$ to $10B_4$) are cascade-connected and which is arranged in a direction opposite a direction of signal propagation in the first delay circuit array.

Each delay unit ($10A_1$ to $10A_4$) of the first delay circuit array includes a delay circuit (11A) which, if the delay unit is the initial delay unit ($10A_1$), receives the first output signal (IP1) that is input to the first delay circuit array from the first phase interpolator ($20_1$), and which if the delay unit is other than the initial delay unit, receives the output of the immediately preceding delay unit, and a latch circuit (12) for sampling and outputting the output of the delay circuit (11A) based upon the second output signal (IP2) of the second phase interpolator ($20_2$). The first delay circuit array measures the phase difference (delay) between the first output signal (IP1) and the second output signal (IP2). When the first output signal (IP1) has traveled along the first delay circuit array by the amount of the delay measured, the latch circuit (12) of the delay unit located at the position corresponding to this point in time serves as a boundary, with the logical value that is the output of the latch circuit (12) of the delay unit ahead of this position being different from the logical value that is the output of the latch circuit (12) of the delay unit in back of this position.

Each delay unit of the second delay circuit array includes a logic circuit (13) and a delay circuit (11B) to which the output of the logic circuit (13) is input. The logic circuit (13) has one input terminal that receives the output of the first delay circuit array if the delay unit is the initial delay unit and that receives the output of the immediately preceding delay unit if the delay unit is other than the initial delay unit, and another input terminal that receives the output signal of the latch circuit (12) of the corresponding delay unit of the first delay circuit array. The output terminal of the second delay circuit array is connected to the one input terminal.

The logic circuit (13) of each delay unit of the second delay circuit array is activated when the output from the latch circuit (12) of the corresponding delay unit of the first delay circuit array, which signal is input to the other input terminal, indicates that this corresponding delay unit is located at a position that corresponds to the delay between the first output signal (IP1) and the second output signal (IP2). When the signal supplied to the other input terminal of the logic circuit (13) is in the activated state, the logic circuit (13) transmits the signal supplied to the one input terminal to the delay circuit (11B). When the signal that is supplied to the other input terminal of the logic circuit (13) is in the deactivated state, the logic circuit (13) outputs a fixed value and does not transmit the signal that has been supplied to the one input terminal to the delay circuit (11B). The frequency-multiplying number and the frequency-dividing number can be set to any arbitrary fraction or integral value by setting the phase difference (delay) between the first output signal (IP1) and second output signal (IP2) and the ratio between the delay times of the delay circuits (11A, 11B) of the first and second delay circuit arrays.

An embodiment of the present invention will now be described in detail with reference to the drawings.

FIG. 1 illustrates the structure of a clock generating circuit according to a preferred embodiment of the present invention. As shown in FIG. 1, the clock generating circuit includes phase interpolators $20_1$ and $20_2$ in which the phases of the output signals thereof with respect to the input signals thereof are variably controlled by a control signal; a delay-measurement first delay circuit array (delay circuits $10A_1$ to $10A_4$); and a delay-replay second delay circuit array (delay circuits $10B_1$ to $10B_4$). The phase interpolators $20_1$ and $20_2$ are of any well-known structure. The delay-replay second delay circuit array is such that the direction of signal travel through the array is opposite that of the delay-measurement first delay circuit array.

Figure 9:
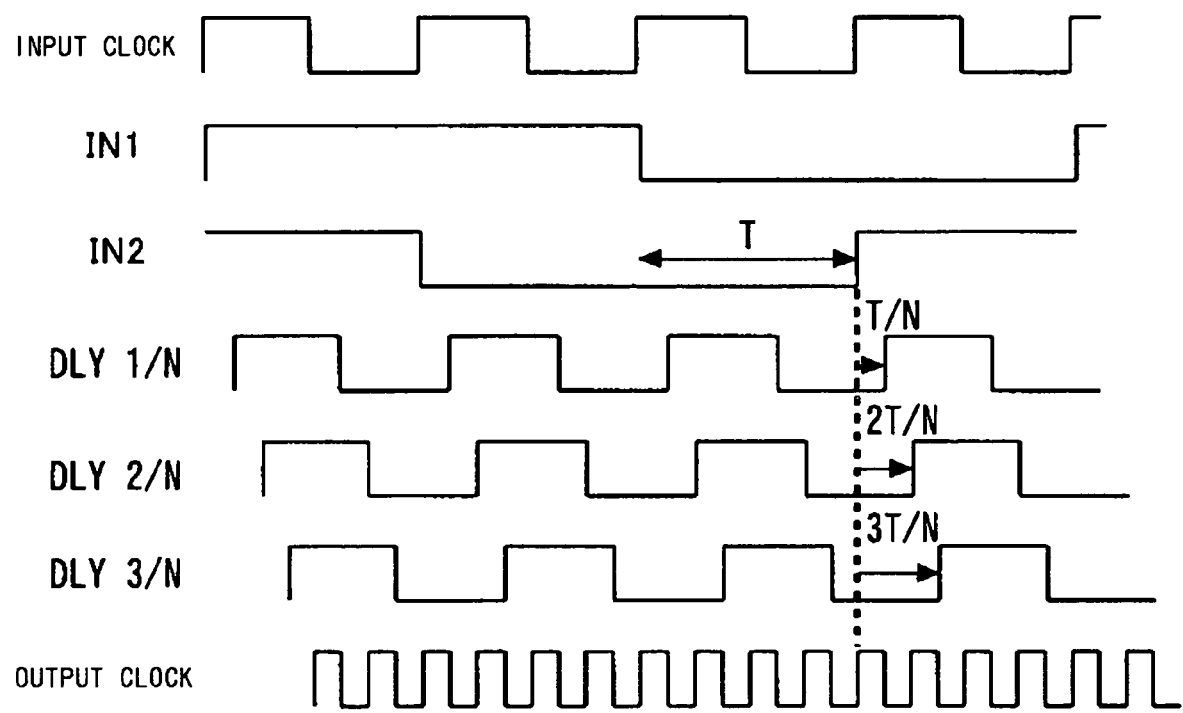
FIG. 9 is a timing chart useful in describing the operation of the clock frequency multiplier circuit that employs the SMD according to the prior art.

Signals IN1 and IN2 in FIG. 1 are similar to signals IN1 and IN2 in FIG. 9. Specifically, IN1 is a frequency-divided clock and IN2 is a signal that transitions at a timing that lags behind the frequency-divided clock by one period (T) of the input clock signal CLK. In the example shown in FIG. 1, a signal that is the result of frequency-dividing the input clock signal CLK by the frequency divider 30 is adopted as IN1, and a signal that is the result of sampling the signal IN1 at the rising edge of the input clock signal CLK by a flip-flop (edge-triggered register) 31 (namely the output at the inverting output terminal) is adopted as IN2. The phase interpolators $20_1$ and $20_2$ output signals IP1, IP2, respectively, obtained by adjusting the phases of the signals IN1, IN2, respectively. In the present embodiment, the delay-measurement first delay circuit array (delay circuits $10A_1$ to $10A_4$) essentially measures the difference in the delay between the signals IP1 and IP2.

The second delay circuit array has an output terminal OUT connected for feedback to an input gate of each of the delay circuits $10B_1$ to $10B_4$ of the second delay circuit array. The output terminal OUT is connected to the output terminal of each delay circuit. Based upon the signal that is output from the delay circuit at the position where one clock period has been detected in the delay-measurement first delay circuit array, the gate of the delay circuit in the second delay circuit array that corresponds to this position in the first delay circuit array is turned on so that the output terminal OUT is connected for feedback to the input of this delay circuit, thereby constructing an oscillator circuit. The gates of the other delay circuits of the second delay circuit array are turned off and therefore do not transmit signals.

Figure 2:
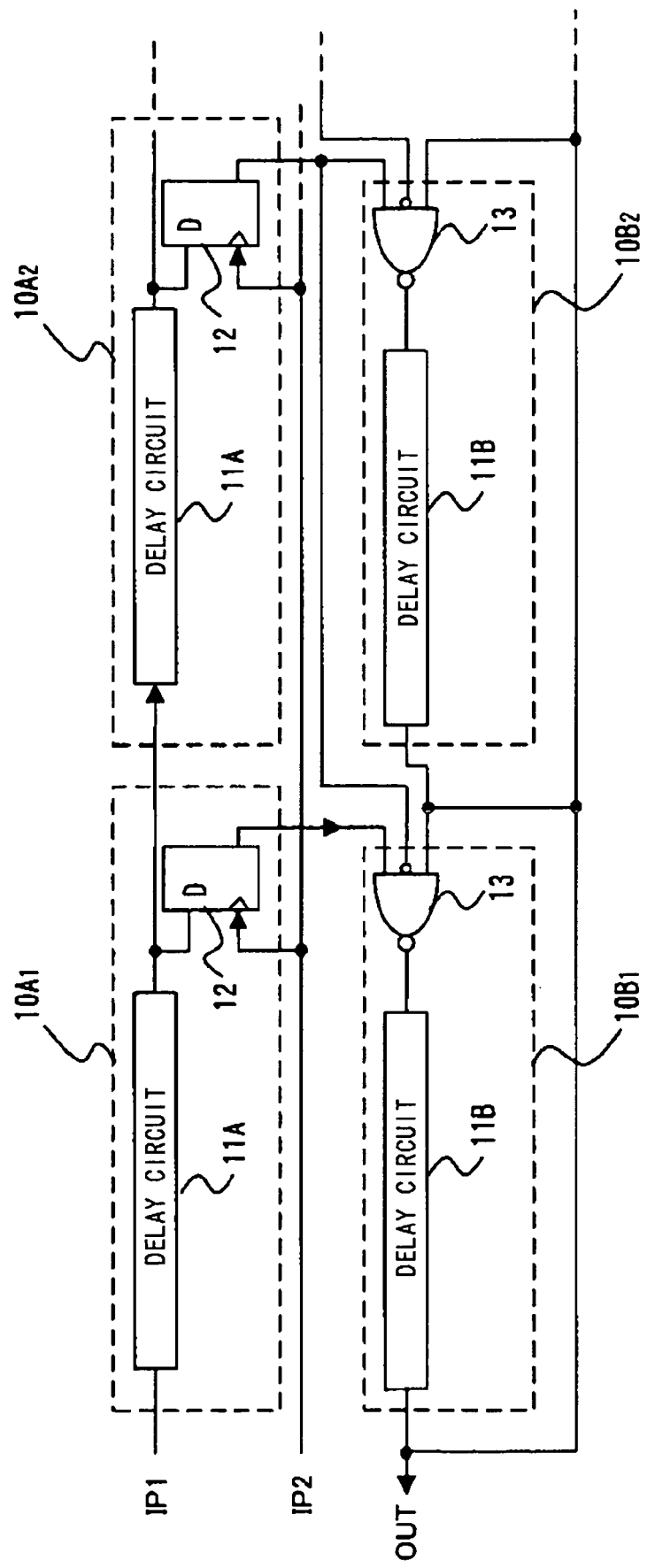
FIG. 2 is a diagram illustrating the structural details of the embodiment.

FIG. 2 illustrates an example of the structures of delay circuits shown in FIG. 1. As shown in FIG. 2, each of the delay circuits $10A_1$ to $10A_4$ that construct the delay-measurement first delay circuit array includes a delay circuit (delay element) 11A, and a flip-flop 12, which has a data terminal D that receives the output of the delay circuit 11A and a clock input terminal CK that receives the output signal $IP2$ of the phase interpolator $20_2$, for sampling and outputting the signal at the data terminal D at the rising edge of the output signal IP2. The delay circuit 11A of the initial delay circuit $10A_1$ receives the signal IP1 from the phase interpolator $20_1$ and outputs the signal upon delaying it. The delay circuits 11 of other delay circuits $10A_2$ to $10A_4$ from the second onward receive as inputs the outputs of the immediately preceding delay circuits.

Each of the delay circuits $10B_1$ to $10B_4$ that constructs the delay-replay second delay circuit array includes a NAND gate 13 and a delay circuit (delay element) 11B that receives the output of the NAND gate 13. The NAND gate 13 of each of the delay circuits $10B_1$ to $10B_4$ receives the outputs of two flip-flops 12, namely the output of the flip-flop 12 of the corresponding delay circuit stage in the delay-measurement first delay circuit array (delay circuits $10A_1$ to $10A_4$) and the output of the flip-flop 12 of the next delay circuit stage in the delay-measurement first delay circuit array, and the output of the immediately preceding delay circuit in the delay-replay second delay circuit array. The output terminal OUT of the delay-replay second delay circuit array (namely the output of the delay circuit $10B_1$) is feedback-connected to the NAND gates 13 of the delay-replay second delay circuit array (delay circuits $10B_1$ to $10B_4$).

In the present embodiment, first, second and third input terminals of the NAND gate 13 in delay circuit $10B_1$ are connected to the output of the flip-flop 12 of delay circuit $10A_1$, to the output (inverted signal) of the flip-flop 12 in delay circuit $10A_2$ and to a connection node between the output of delay circuit 11B in delay circuit $10B_2$ and the output terminal OUT, respectively. The first, second and third input terminals of the NAND gate 13 in delay circuit $10B_2$ are connected to the output of the flip-flop 12 of delay circuit $10A_2$, to the output (inverted signal) of the flip-flop 12 in delay circuit $10A_3$ and to a connection node between the output of delay circuit 11B in delay circuit $10B_3$ and the output terminal OUT, respectively. The first, second and third input terminals of the NAND gate 13 in delay circuit $10B_4$ that is the final stage of the second delay circuit array are connected to the output of flip-flop 12 of delay circuit $10A_4$ that is the final stage of the first delay circuit array, to a fixed low level and to the output terminal OUT, respectively.

The output terminal OUT (the output of the delay circuit 11B of delay circuit $10B_1$) and the outputs of the delay circuits 11B of the delay circuits $10B_1$ to $10B_4$ are wired in common to the input terminals of the NAND gates 13 of each of the delay circuits $10B_1$ to $10B_4$.

The delay circuits in the delay-replay second delay circuit array compose a ring oscillator and are capable of oscillating at a desired frequency. Such an arrangement makes it possible to curtail the measurement delay elements and reduce power dissipation by shortening the measurement period.

By way of example, if the delay time of the signal IP2 relative to the signal IP1 as measured by the delay-measurement first delay circuit array is equivalent to the amount of delay through two delay circuit stages of the delay-measurement first delay circuit array, then the flip-flop 12 of delay circuit $10A_2$ will output a high-level signal at the rising edge of the signal IP2 and the flip-flop 12 of the delay circuit $10A_3$ will fall to a low level at the rising edge of the signal IP2 (i.e., a pulse propagation is not carried out).

The first and second input terminals of the NAND gate 13 in the delay circuit $10B_2$ of the delay-replay second delay circuit array assume the high and low levels, respectively, and the NAND gate 13 functions as an inverter to invert the signal that passes through the delay circuit 11B.

Meanwhile, the second input terminal of the NAND gate 13 of delay circuit $10B_1$ in the delay-replay second delay circuit array is goes to a high level. The output of the NAND gate 13 is fixed at a high level and masks the signal.

In other words, the outputs of the NAND gates 13 in delay circuits other than the delay circuit $10B_2$ among the delay circuits of the delay-replay second delay circuit array are fixed at a high level (the outputs of the corresponding flip-flops 12 are at a low level) and signals do propagate through these circuits.

The stage of the delay circuit whose NAND gate 13 functions as an inverter among the delay circuits of the delay-replay second delay circuit array corresponds to the delay circuit stage at which the input signal IP1 has propagated through the equivalent of one period in the delay-measurement first delay circuit array (delay circuits $10B_1$ to $10B_4$).

In the delay-measurement first delay circuit array (delay circuits $10A_1$ to $10A_4$), the output of the flip-flop 12 in the delay circuit stage where the signal IP1 has propagated through the equivalent of the phase difference (delay) between the signal IP1 and the signal IP2 and the output of the flip-flop 12 in the succeeding delay circuit stage define the boundary between the high ("1") and low ("0") levels. In the delay-replay second delay circuit array, the output of the NAND gate ahead of this boundary and the output of the NAND gate in back of this boundary are fixed at a high level.

The first and second input terminals of the NAND gate 13 in the delay circuit $10B_2$ are at the high and low levels, respectively, and the third input terminal is at a high level. The output of this NAND gate 13, therefore, is at a low level and the delay circuit 11B of the delay circuit $10B_2$ outputs a low level signal. The loop of the delay circuit 11B and the NAND gate 13 that functions as an inverter constructs a delay-time oscillator circuit (a ring oscillator). The period of oscillation thereof depends upon the delay time of the delay circuit 11B. If we let t represent the delay time of the closed loop (the closed loop of the delay circuit 11B and NAND gate 13) of the ring oscillator, then the period of oscillation will be given by 2 t.

Figure 8:
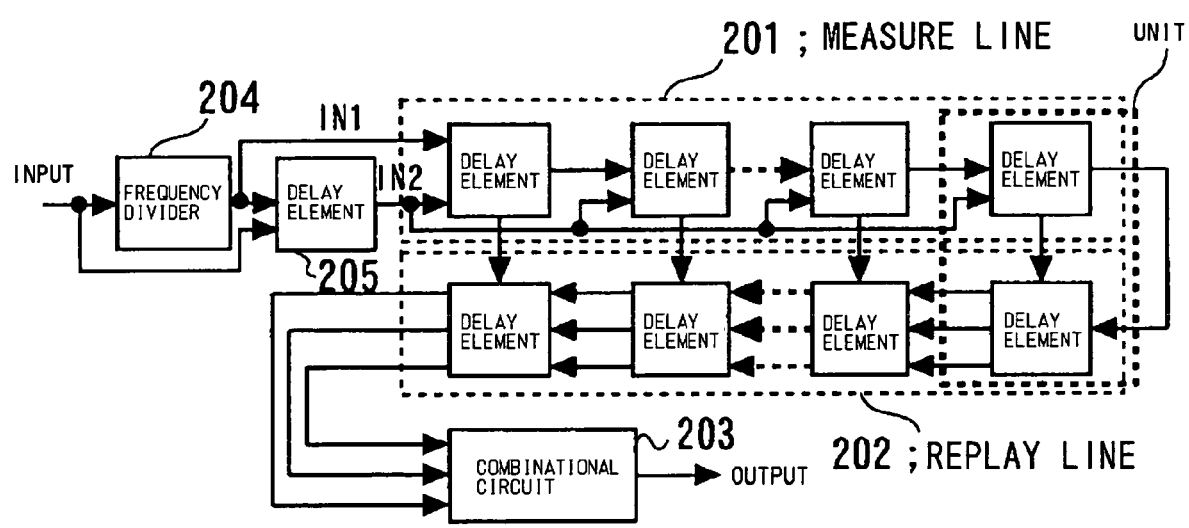
FIG. 8 is a block diagram illustrating the structure of a clock frequency multiplier circuit that employs an SMD according to the prior art.

In accordance with the present invention, as described above, a complicated combinational circuit of the kind shown in FIG. 8 is made unnecessary and it possible to generate a clock signal that is synchronized to the input clock. Furthermore, a clock of any desired fractional frequency-multiplying number can be produced by a combination of the interpolated values of the input-signal phase and the ratio between the delays of the delay circuits 11A and 11B.

More specifically, in a conventional clock multiplier circuit that employs an interpolator and an SMD (synchronous mirror delay), the combinational circuit (203 in FIG. 8) for frequency multiplication is required. By contrast, in accordance with the present invention, a ring oscillator is made to oscillate directly in an SMD (synchronous mirror delay) comprising the first and second delay circuit arrays. A sequence for combining outputs of the SMD is no longer required in the frequency multiplied output.

Further, in accordance with the present embodiment, the frequency-multiplying number can be increased greatly.

With the conventional frequency multiplier circuit that employs an interpolator and an SMD, a higher degree of frequency multiplication is accompanied by an increase in area. By contrast, in accordance with the present invention, the number of delay element stages can be reduced even in a case where the frequency-multiplying number is made high. Further, in comparison with the prior-art arrangement, area can be reduced for the same frequency-multiplying number.

Furthermore, in accordance with the present invention, a fractional frequency-multiplied or frequency-divided clock can be provided at high speed by setting the ratio between the delay times of the delay circuit 11A and delay circuit 11B. In a case where it is assumed that one clock period T has been measured by the first delay circuit array, a frequency dividing circuit is constructed if the delay time of the delay circuit 11B is m (m>1) times the delay time of the delay circuit 11A, and a frequency multiplying circuit is constructed if the delay time of the delay circuit 11A is n (n>1) times the delay time of the delay circuit 11B.

The delay circuits (delay unit elements) of the delay-measurement first delay circuit array and delay-replay second delay circuit array of the SMD are constituted by inverters.

The operating sequence of the frequency multiplying circuit shown in FIG. 1 is as set forth below. If the desired frequency-multiplying number is N, then a delay of T/(2N) is produced with respect to the input clock signal (of period T) in the phase interpolators 20$_1$, 20$_2$.

The delay of T/(2N) is measured in the delay-measurement first delay circuit array that constructs the SMD. Inverters are arrayed (in an inverter row) for every frequency-multiplying number, and the input signal IP1 that travels along the first delay circuit array is latched by the signal IP2, which lags behind by T/(2N), in the flip-flop 12 (see FIG. 2) that receives the signal from the delay circuit 11A that is for delay measurement.

The length of duplication delay time (replay line) of the second delay circuit array is decided based upon the period of time (delay) measured by the first delay circuit array.

The output of the ring oscillator formed in the second delay circuit array is fed back to the duplication delay time (replay line).

The ring oscillator comprises an inverting closed loop (odd-number of cascade-connected inverters) constituted by the delay circuit 11B and NAND gate 13 (which functions as an inverter). If the propagation delay time of the closed loop is t, then the oscillator will oscillate at 2t. Accordingly, the oscillation period of the ring oscillator is 2t=T/N, which represents frequency multiplication by N with respect to the input clock (of period T).

In a case where frequency multiplication by 1.25 is to be obtained, the following are set as combinations that will give 1/2.5 in regard to the phase interpolators (IP) 20$_1$, 20$_2$ and SMD, which comprises the first and second delay circuit arrays:

IP=1/5, SMD=2;

IP=1/10, SMD=4;

and so on.

In other words, fractional frequency division of 1/2.5 can be realized by frequency multiplication by 1/5 (frequency division by 5) in the phase interpolators (IP) and frequency multiplication by 2 in the SMD.

When frequency multiplication by 4.7 is to be obtained, the following should be set as a combination that will give 1/9.4:

IP=10/47, SMD=1/2 and so on.

Thus, oscillation of a fractional multiple (period) is achieved based upon the combination of phase interpolation values of the phase interpolators 20$_1$ and 20$_2$ that adjust the delay of the input signal to the first delay circuit array, and the return value of the delay value in the SMD comprising the first and second delay circuit arrays (the delay value of the delay circuits of the second delay circuit array).

Figure 7:
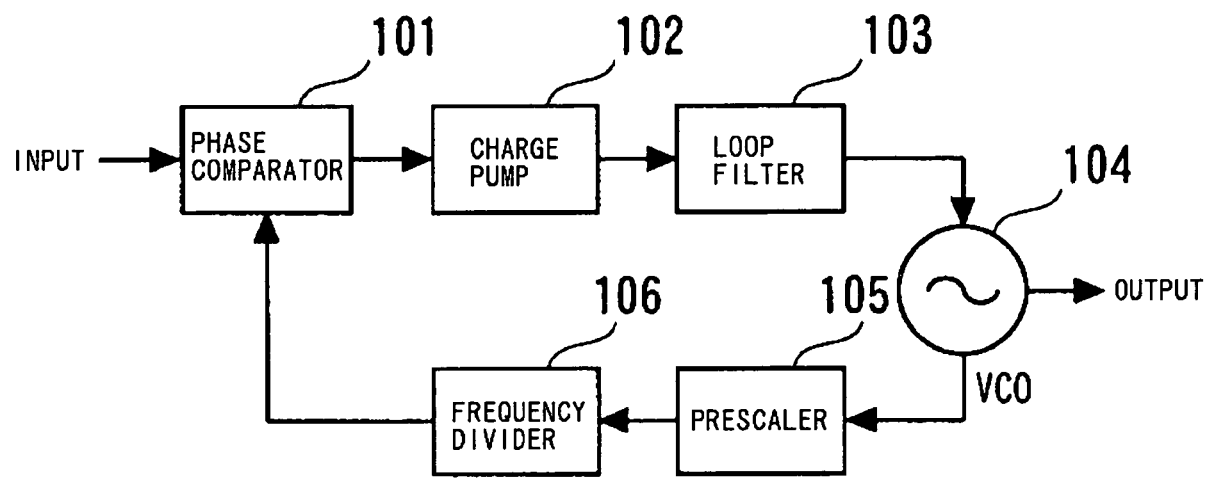
FIG. 7 is a diagram illustrating an example of the structure of a PLL circuit.

In other words, according to the present embodiment, an input clock can be converted to a clock that has been multiplied by a desired fraction or integer. Complicated control such as provision of a pulse-swallow counter shown in FIG. 7 is unnecessary.

By producing the signals IP1 and IP2 in the phase interpolators 20$_1$ and 20$_2$ such that the phase difference becomes a multiple of F/M of the period T of the input clock signal CLK and compressing the phase difference between the clocks IP1 and IP2 to such a phase difference that is a multiple of G/N by the circuit arrangement of FIG. 1, the ring oscillator comprising the delay circuit 11B and NAND gate 13 of the second delay circuit array can be made to oscillate at a frequency that is FG/(2MN) times the frequency of the input clock signal CLK. Here F, G, M and N are arbitrary positive integers. It should be noted that M of F/M in the phase interpolators 20$_1$ and 20$_2$ represents the resolution (step) of the internal ratio of the interpolators, and F represents an integer that is set by the control signal. G/N is decided by the ratio between the delay times of the delay circuit 11A and delay circuit 11B, by way of example.

Figure 3:
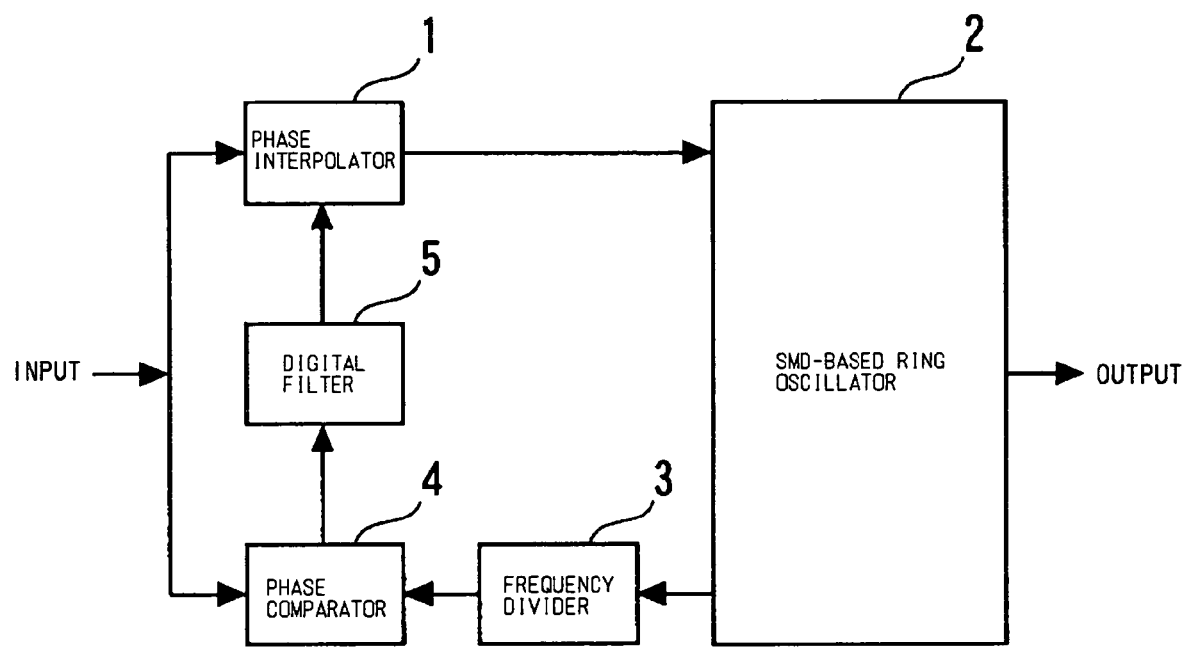
FIGS. 3 and 4 are block diagrams illustrating other embodiments of the present invention.

FIG. 3 is a diagram illustrating the structure of another embodiment of the present invention. This diagram illustrates an arrangement in which a frequency-multiplied clock (Fosc) is output with respect to an input clock by the operation of the frequency multiplying circuit described above. In FIG. 3, a ring oscillator (ROSC) 2 based upon an SMD (synchronous mirror delay) circuit is the clock generating circuit of the embodiment of the invention described above with reference to FIGS. 1 and 2. A phase interpolator 1 in FIG. 3 corresponds to the phase interpolators 20$_1$, 20$_2$ of FIG. 1. The ring oscillator (ROSC) 2 based upon the SMD comprises the first delay circuit array (delay circuits 10A$_1$ to 10A$_4$) and the second delay circuit array (delay circuits 10B$_1$ to 10B$_4$) of FIG. 1.

A frequency dividing circuit (frequency divider) 3 performs frequency-division of the output of SMD-based ring oscillator (ROSC) 2. Here the frequency dividing circuit 3 can employ an oscillator circuit of oscillation period T, which is the reciprocal of the frequency multiplier N of the interpolator and SMD in the ring oscillator (ROSC) 2.

The operating sequence of the circuit shown in FIG. 3 is as set forth below.

The ring oscillator 2 outputs the frequency-multiplied clock Fosc with respect to the input clock signal in accordance with the operation of the frequency multiplying circuit described in the foregoing embodiment.

The frequency dividing circuit 3 generates a clock Fsig the frequency of which is the same as the input frequency for phase comparison.

A phase comparator 4 compares the input clock signal and the output Fsig of the frequency dividing circuit 3 and generates an error quantity.

A digital filter 5 quantifies (integrates) the error quantity and controls an increase or decrease in F of the phase interpolation quantity F/M of the phase interpolator 1. Here M represents the resolution of the phase interpolator 1 and is assumed to be 16 or 256, by way of example.

The above-described sequence is repeated. When the error quantity falls below a set value, a clock signal frequency-multiplied or frequency-divided by N and synchronized to the input clock signal is generated and output.

When frequency multiplication by a factor of 5 is to be produced, the period of the input clock is made 20/100 (which is equivalent to 1/5) in the phase interpolator 1, and 1/2 is used in the SMD. As a result, the ring oscillator 2 based upon the SMD will oscillate at the following period:

$$20/100 \times 1/2 \times 2 \times T = T/5$$

The signal Fsig for phase-comparison, that is out put from separate from the output clock is a clock signal obtained by dividing Fosc by 5 by the phase dividing circuit 3. The signal Fsig is returned to the phase comparator 4. The error quantity compared by the phase comparator 4 is quantified by the digital filter 5, and the numerator of the phase interpolator 1 is increased or decreased. In other words, the phase interpolator 1 controls the amount of phase interpolation in the manner 19/100 or 22/100, etc., of one clock period.

Figure 4:
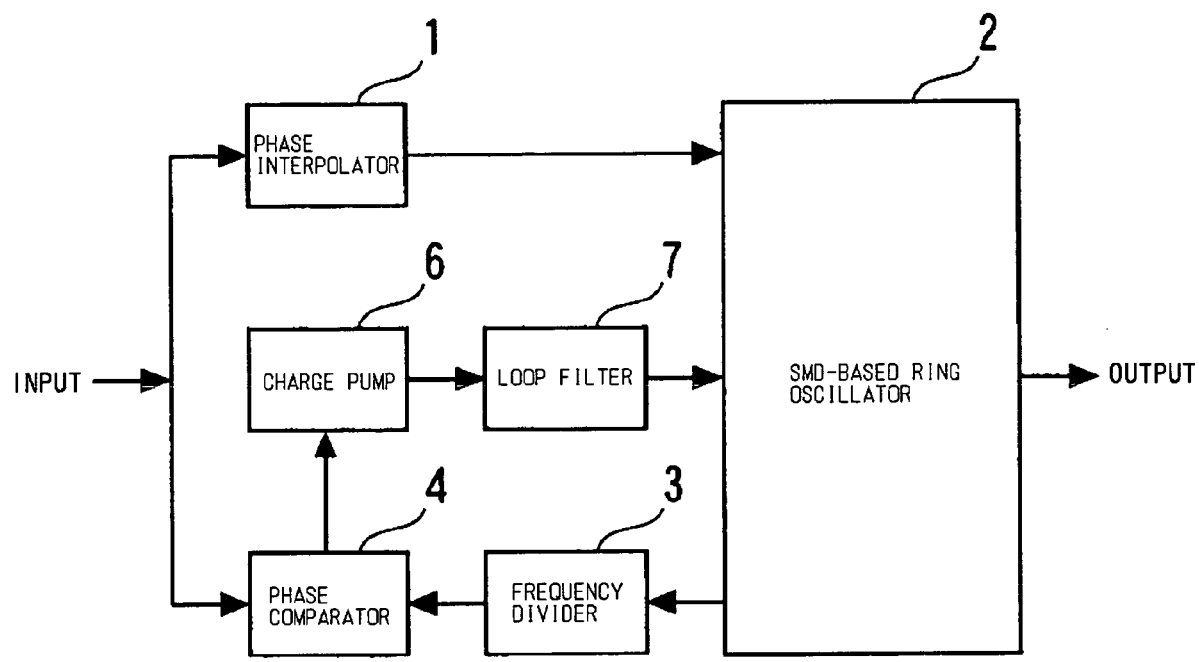

FIG. 4 is a diagram illustrating the structure of a further embodiment of the present invention. It may be so arranged that the output of a loop filter 7 is returned to the input of a clock gate within the SMD-based ring oscillator 2 using a charge pump 6 and the loop filter 7, as illustrated in FIG. 4. The phase interpolator 1 of FIG. 4 corresponds to the phase interpolators $20_1$ and $20_2$ of FIG. 1. The ring oscillator (ROSC) 2 based upon the SMD comprises the first delay circuit array (delay circuits $10A_1$ to $10A_4$) and the second delay circuit array (delay circuits $10B_1$ to $10B_4$) of FIG. 1.

The amount of phase error is converted to voltage by the charge pump 6 and loop filter 7 and the gain of the ring oscillator 2 is controlled to thereby vary the oscillation frequency.

Figure 5:
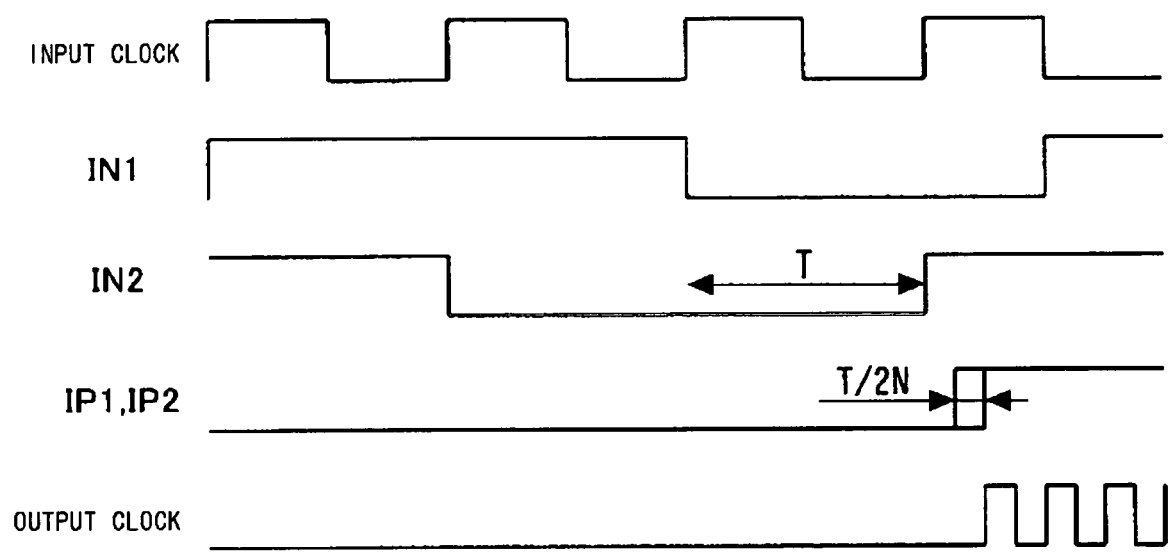
FIG. 5 is a timing chart useful in describing an example of operation of an embodiment of the present invention.

FIG. 5 is a timing chart useful in describing an example of operation. In FIG. 1, the signal IN1 obtained by frequency-dividing the input clock signal CLK in the frequency divider 30 is input to the phase interpolator $20_1$, and the signal IN2 obtained by latching the signal IN1 in the flip-flop 31 is input to the phase interpolator $20_2$. The output signal IP2 of phase interpolator $20_2$ lags behind the signal IP1, which is the output of the phase interpolator $20_1$, by the phase difference T/2N. The oscillation period of the ring oscillator in the second delay circuit array becomes T/N, and the output terminal OUT of the second delay circuit array is a clock whose frequency has been multiplied by N with respect to the input clock (of period T).

Figure 6:
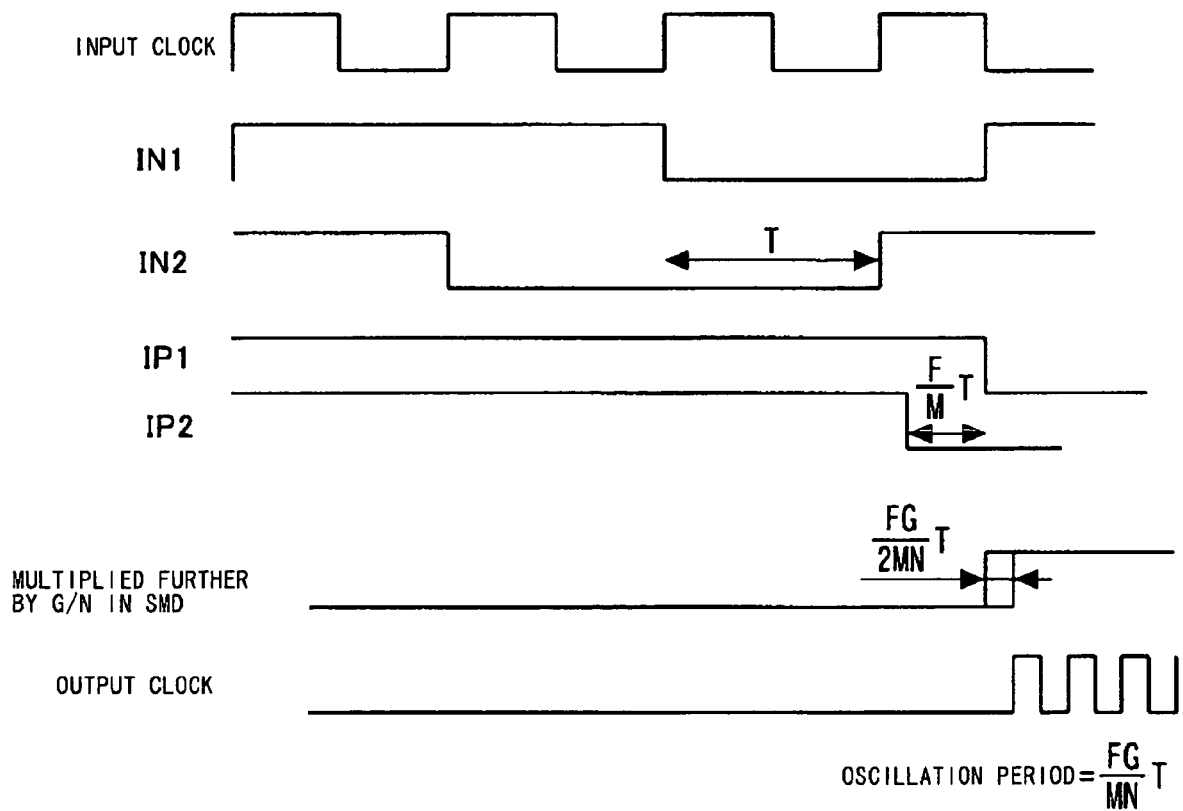
FIG. 6 is a timing chart useful in describing another example of operation of an embodiment of the present invention.

FIG. 6 is a timing chart of the SMD-based ring oscillator 2 in the case where the phase interpolator 1 is used. The phase control in the phase interpolators $20_1$ and $20_2$ in FIG. 1 is such that (F/M)T holds, wherein the signal IP2 lags behind the signal IP1 by the phase difference (F/M)T (where T represents the period of the input clock signal CLK). The phase difference (F/M)T is compressed to a phase difference that is a factor of G/N by the SMD, and the ring oscillator can be made to oscillate at a period that is FG/(2MN) times the period of the input clock signal. Here F, G, M and N are arbitrary positive integers. It should be noted that M of F/M in the phase interpolators $20_1$ and $20_2$ represents the resolution (step) of the internal ratio of the interpolators, and F is set by the control signal.

As many apparently widely different embodiments of the present invention can be made without departing from the spirit and scope thereof, it is to be understood that the invention is not limited to the specific embodiments thereof except as defined in the appended claims.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A clock generating circuit comprising:
   a first delay circuit array for delay measurement having a plurality of delay circuits, said first delay circuit array receiving an input signal and outputting a signal from a delay circuit at a position to which the applied input signal has traveled following a prescribed delay time; and
   a second delay circuit array for delay-replay having a plurality of delay circuits and being arranged in a direction opposite a direction of signal propagation in said first delay circuit array;
   wherein on the basis of the signal output from the delay circuit at the position where the delay has been detected in said first delay circuit array, an output terminal of a delay circuit in said second delay circuit array that corresponds to the position where the delay has been detected in said first delay circuit array is fed back to an input terminal of the delay circuit to thereby construct a closed-loop oscillator circuit, an oscillation output signal being extracted from said oscillator circuit at an output terminal of said second delay circuit array.

2. The clock generating circuit according to claim 1, wherein delay circuits other than the delay circuit of said second delay circuit array that corresponds to the position where the delay has been detected do not transmit signals to succeeding delay circuits.

3. The clock generating circuit according to claim 1, comprising a phase interpolator arranged in front of said first delay circuit array; said phase interpolator receiving an input signal and outputting an output signal, the phase of the output signal with respect to the input signal being controlled so as to vary based upon a control signal received, the delay of the input signal applied to said first delay circuit array being set changeably.

4. A clock generating circuit comprising:
   a frequency divider, receiving an input clock signal, for dividing frequency of the input clock signal;
   a first phase interpolator, receiving the frequency-divided clock as an input signal, for variably interpolating the phase of a first output signal thereof with respect to the input signal thereof based upon a control signal received and outputting the resultant signal;

a latch circuit, receiving the frequency-divided clock signal, for sampling the frequency-divided clock signal based upon the input clock signal to output the so sampled clock signal;

a second phase interpolator, receiving the clock signal output from said latch circuit as an input signal, for variably interpolating the phase of a second output signal with respect to the input signal thereof based upon a control signal received and outputting the resultant signal;

a first delay circuit array having a plurality of delay units cascade-connected and receiving the first and second output signals from said first and second phase interpolators, respectively; and a second delay circuit array having a plurality of delay units cascade-connected and being arranged in a direction opposite a direction of signal propagation in said first delay circuit array;

wherein each delay unit of said first delay circuit array includes:

a delay circuit which, if said delay unit is an initial delay unit, receives the first output signal supplied to said first delay circuit array from said first phase interpolator, and which if said delay unit is other than the initial delay unit, receives an output of an immediately preceding delay unit; and a latch circuit for sampling and outputting the output of said delay circuit based upon the second output signal of said second phase interpolator; and each delay unit of said second delay circuit array includes:

a logic circuit; and a delay circuit receiving an output of said logic circuit as an input;

said logic circuit having one input terminal that receives an output of said first delay circuit array if said delay unit is the initial delay unit and that receives the output of said immediately preceding delay unit if the delay unit is other than the initial delay unit, and another input terminal that receives an output of the latch circuit of the corresponding delay unit of said first delay circuit array, an output terminal of said second delay circuit array being connected to said one input terminal.

5. The clock generating circuit according to claim 4, wherein said logic circuit of the delay unit of said second delay circuit array is activated, when the output from said latch circuit of the corresponding delay unit of said first delay circuit array, that is supplied to said other input terminal, indicates that this corresponding delay unit is located at a position that corresponds to a delay between the first output signal and the second output signal; and when the signal supplied to said other input terminal of said logic circuit is in an activated state, said logic circuit controls to transmit the signal supplied to said one input terminal to said delay circuit; and when the signal supplied to said other input terminal of said logic circuit is in a deactivated state, said logic circuit outputs a fixed value and does not transmit the signal supplied to said one input terminal to said delay circuit.

6. The clock generating circuit according to claim 4, wherein, when in the activated state, said logic circuit functions as an inverter circuit for inverting the signal supplied to said one input terminal;

said delay circuit and said logic circuit composing a ring oscillator.

7. The clock generating circuit according to claim 4, wherein said logic circuit comprises a 3-input NAND gate having:

a first input terminal which, if said delay unit is the initial delay unit, receives the output of said first delay circuit array, and which if said delay unit is other than the initial delay unit, receives the output of the immediately preceding delay unit;

a second input terminal for receiving the output of said latch circuit of said corresponding delay unit of said first delay circuit array; and a third input terminal for receiving an inverted signal of the output from a latch circuit of a delay unit that succeeds said corresponding delay unit of said first delay circuit array;

the output terminal of said second delay circuit array being feedback-connected to said one input terminal.

8. The clock generating circuit according to claim 3, wherein fractional frequency multiplication and fractional frequency division can be produced variably based upon a combination of interpolated values in said phase interpolators and ratio of delay times of the delay circuits in said first and second delay circuit arrays.

9. A clock generating circuit apparatus comprising:

an oscillator including the clock generating circuit set forth in claim 1;

a frequency divider for dividing the frequency of an output of said oscillator;

a phase comparator for comparing the phase of an output of said frequency divider and the phase of an input signal;

a digital filter for smoothing an output of said phase comparator that is input thereto; and a phase interpolator, receiving an output of said digital filter as a control signal, for variably controlling the phase of an output signal thereof with respect to an input signal thereof;

an output of said phase interpolator being input to first delay circuit array.

10. A clock generating circuit apparatus comprising:

an oscillator including the clock generating circuit set forth in claim 3;

a frequency divider for dividing the frequency of an output of said oscillator;

a phase comparator for comparing the phase of an output of said frequency divider and the phase of an input signal; and a digital filter for smoothing an output of said phase comparator that is input thereto;

the phase interpolator of said clock generating circuit receiving an output of said digital filter as a control signal.

11. A clock generating circuit apparatus comprising:

an oscillator including the clock generating circuit set forth in claim 3;

a frequency divider for dividing the frequency of an output of said oscillator;

a phase comparator for comparing the phase of an output of said frequency divider and the phase of an input signal;

a charge pump for receiving an output of said phase comparator and charging and discharging a capacitor; and a filter for smoothing an output of said charge pump;

the second delay circuit array of said clock generating circuit having its delay variably controlled based upon an output of said filter.

12. A clock generating circuit apparatus comprising:

an oscillator including the clock generating circuit set forth in claim 4;

a frequency divider for dividing the frequency of an output of said oscillator;

a phase comparator for comparing the phase of an output of said frequency divider and the phase of an input signal; and a digital filter for smoothing an output of said phase comparator that is input thereto;

the phase interpolator of said clock generating circuit receiving an output of said digital filter as a control signal.

13. A clock generating circuit apparatus comprising:

an oscillator including the clock generating circuit set forth in claim 4;

a frequency divider for dividing the frequency of an output of said oscillator;

a phase comparator for comparing the phase of an output of said frequency divider and the phase of an input signal;

a charge pump for receiving an output of said phase comparator and charging and discharging a capacitor; and a filter for smoothing an output of said charge pump;

the second delay circuit array of said clock generating circuit having its delay variably controlled based upon an output of said filter.

\* \* \* \* \*